(12) United States Patent
Monfray et al.

(10) Patent No.: US 7,892,927 B2
(45) Date of Patent: Feb. 22, 2011

(54) TRANSISTOR WITH A CHANNEL COMPRISING GERMANIUM

(75) Inventors: Stephane Monfray, Grenoble (FR); Thomas Skotnicki, Crolles-Montfort (FR); Didier Dutartre, Meylan (FR); Alexandre Talbot, Grenoble (FR)

(73) Assignees: STMicroelectronics SA, Montrouge (FR); STMicroelectronics (Crolles 2) SAS, Crolles (FR)

( * ) Notice: Subject to any disclaimer, the term of this patent is extended or adjusted under 35 U.S.C. 154(b) by 27 days.

(21) Appl. No.: 11/725,160

(22) Filed: Mar. 16, 2007

(65) Prior Publication Data

US 2008/0020532 A1 Jan. 24, 2008

(30) Foreign Application Priority Data

Mar. 21, 2006 (FR) .................................. 06 02467

(51) Int. Cl.
*H01L 21/336* (2006.01)
(52) U.S. Cl. .................. 438/285; 438/363; 438/300; 438/164; 257/216; 257/219; 257/E21.409; 257/E29.053; 257/E29.054; 257/E29.055; 257/E29.193
(58) Field of Classification Search ........... 438/285, 438/363, 300, 164; 257/E21.409, E29.053, 257/E29.054, E29.055, 216, 219, E29.193
See application file for complete search history.

(56) References Cited

U.S. PATENT DOCUMENTS

| 6,433,382 | B1 * | 8/2002 | Orlowski et al. | 257/315 |
| 6,713,356 | B1 * | 3/2004 | Skotnicki et al. | 438/285 |
| 6,949,761 | B2 * | 9/2005 | Chu et al. | 257/19 |
| 7,057,216 | B2 * | 6/2006 | Ouyang et al. | 257/194 |
| 2001/0045604 | A1 * | 11/2001 | Oda et al. | 257/350 |
| 2003/0077867 | A1 * | 4/2003 | Fitzergald | 438/285 |
| 2004/0217434 | A1 * | 11/2004 | Lee et al. | 257/412 |
| 2005/0029603 | A1 | 2/2005 | Yu et al. | |
| 2005/0070053 | A1 * | 3/2005 | Sadaka et al. | 438/151 |
| 2005/0118783 | A1 * | 6/2005 | Oh et al. | 438/421 |
| 2005/0169096 | A1 | 8/2005 | Lee et al. | |

(Continued)

FOREIGN PATENT DOCUMENTS

WO   WO 2006117734 A1 * 11/2006

OTHER PUBLICATIONS

Tsutomu Tezuka et al., "High-Mobility Strained SiGe-on-Insulator pMOSFETs with Ge-Rich Surface Channels Fabricated by Local Condensation Technique," IEEE Electron Device Letters, vol. 26, No. 4, Apr. 2005, pp. 243-245.

(Continued)

*Primary Examiner*—David Vu
*Assistant Examiner*—Brandon Fox

(57) ABSTRACT

A transistor including a germanium-rich channel. The germanium-rich channel is produced by oxidation of the silicon contained in the silicon-germanium intermediate layer starting from the lower surface of the said intermediate layer. The germanium atoms are therefore caused to migrate towards the upper surface of the silicon-germanium intermediate layer, and are stopped by the gate insulating layer. The migration of the atoms during the oxidation step is thus less prejudicial to the performance of the transistor, since the gate insulator of the transistor has already been produced and is not modified during this step. The migration of the germanium atoms towards the gate insulator, which is immobile, leads to a limitation of the surface defects between the channel and the insulator.

20 Claims, 3 Drawing Sheets

U.S. PATENT DOCUMENTS

2005/0277271 A1* 12/2005 Beintner et al. ............. 438/478
2006/0091426 A1* 5/2006 Hara ......................... 257/211

OTHER PUBLICATIONS

Tatsuro Maeda et al., "High Mobility Ge-on-Insulator p-Channel MOSFETs Using Pt Germanide Schottky Source/Drain," IEEE Electron Device Letters, vol. 26, No. 2, Feb. 2005, pp. 102-104.

Tsutomu Tezuka et al., "Selectively-formed high mobility SiGe-on-Insulator pMOSFETs with Ge-rich strained surface channels using local condensation technique," 2004 Symposium on VLSI Technology Digest of Technical Papers, pp. 198-199.

A. Talbot et al., "Investigation of Facet Formation in RTCVD Si/SiGe Selective Epitaxy," 1 page, 2004.

* cited by examiner

TRANSISTOR WITH A CHANNEL COMPRISING GERMANIUM

CROSS-REFERENCE TO RELATED APPLICATIONS

The present application is related to French Patent Application No. 0602467, filed Mar. 21, 2006, entitled "METHOD FOR PRODUCING A TRANSISTOR WITH A CHANNEL COMPRISING GERMANIUM". French Patent Application No. 0602467 is assigned to the assignee of the present application and is hereby incorporated by reference into the present disclosure as if fully set forth herein. The present application hereby claims priority under 35 U.S.C. §119(a) to French Patent Application No. 0602467.

TECHNICAL FIELD

The present disclosure relates to integrated circuits and, more particularly, to metal-oxide-semiconductor (MOS) transistors having silicon-germanium on an insulator channel.

BACKGROUND

The development of smaller and smaller transistors has led to the architecture of the transistors being changed in order to overcome certain problems, particularly Short Channel Effects (SCEs) or Drain Induced Barrier Lowering (DIBL). In particular, fully depleted architectures have been employed in order to avoid these effects. At the same time, however, the performance improvement of transistors has led to attempts at replacing silicon by germanium, which has a lower resistivity. The development of a transistor whose channel comprises germanium and is produced on an insulating layer therefore presents a significant benefit, and would make it possible to obtain a transistor with enhanced performance.

One conventional method for producing such an architecture is presented in the article "High-Mobility Strained SiGe-on-Insulator pMOSFETs With Ge-Rich Surface Channels Fabricated by Local Condensation Technique" by Tezuka et al. (IEEE, Electron Device Letters, Vol. 26, No 4, April 2005). The article generally proposes a method for producing a transistor on a silicon-on-insulator substrate, wherein a silicon-germanium layer is deposited on the substrate and is covered with a silicon layer then with a silicon oxide layer. Oxidation of the silicon is then carried out so as to oxidize a part of the substrate lying between the insulator of the substrate and the silicon oxide layer. The authors then obtain a germanium-rich layer between the insulating layer of the substrate and the silicon oxide layer which has been formed during the oxidation. The silicon oxide layer is etched so as to form the gate insulator, then the gate and the source and drain regions are formed in order to obtain the transistor.

However, conventional methods have several drawbacks which limit its use. First, conventional methods require the production of the transistor on a silicon-on-insulator substrate. Thus, the underlying silicon of the substrate is also oxidized during the oxidation of the silicon of the silicon-germanium. It is therefore difficult to implement such a method on a silicon substrate, since there would no longer be an insulating layer allowing the germanium atoms to be stopped and confined during the oxidation phase.

Furthermore in conventional methods, oxidation of the silicon causes migration of the silicon atoms towards the oxidized surface, whereas the germanium atoms are repelled in the opposite direction. These movements of atoms do not guarantee a good surface quality between the germanium-rich layer and the silicon oxide layer which is formed during the oxidation. However, this interface is important since the germanium-rich layer is used as the channel of the transistor and a part of the silicon oxide layer is used as the gate insulator. The appearance of electrical defects due to surface defects between the channel and the gate insulator is therefore possible.

There is therefore a need for a system and method for producing a transistor with a germanium-rich channel and with a fully depleted architecture. In particular, there is a need for a system and method which can produce such a transistor easily on any type of substrate and which the formation of the channel can be easily controlled

SUMMARY

The present disclosure generally provides a method for producing a transistor with a germanium-rich channel and with a fully depleted architecture, which may be produced easily on any type of substrate and in which the formation of the channel can be easily controlled.

In one embodiment, the present disclosure provides a method for fabricating a metal-oxide semiconductor (MOS) transistor. The method includes disposing an intermediate layer on a substrate. The intermediate layer includes an alloy of silicon and germanium. The method also includes disposing a source, a drain and an insulated gate region above the intermediate layer. The method further includes oxidizing the intermediate layer beginning from a lower surface of the intermediate layer, wherein the oxidizing increases a concentration of the germanium in a channel of the transistor.

In another embodiment, the present disclosure provides a metal-oxide semiconductor (MOS) transistor. The transistor includes an intermediate layer on a substrate, wherein the intermediate layer includes an alloy of silicon and germanium. The transistor also includes a source, a drain and an insulated gate region above the intermediate layer. The transistor further includes an intermediate layer. The intermediate layer is oxidized beginning from a lower surface of the intermediate layer. The oxidizing increases a concentration of the germanium in a channel of the transistor.

In still another embodiment, the present disclosure provides a method for fabricating a semiconductor component. The method includes disposing an intermediate layer on a substrate. The intermediate layer includes an alloy of silicon and germanium. The method further includes disposing a source, a drain and an insulated gate region above the intermediate layer and oxidizing the intermediate layer beginning from a lower surface of the intermediate layer. The oxidizing increases a concentration of the germanium in a channel of the transistor and wherein the lower surface of the intermediate layer is disposed on a sacrificial layer formed above the substrate and is disposed on a first layer containing an alloy of silicon and germanium. The method still further includes etching the sacrificial layer to obtain a tunnel exposing the lower surface of the intermediate layer and oxidizing the lower surface of the intermediate layer in the tunnel. The method yet further includes forming the first layer and the intermediate layer by facetless epitaxy. Finally, the method includes selectively etching the sacrificial layer with respect to the first layer and the intermediate layer.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

Figure 1:
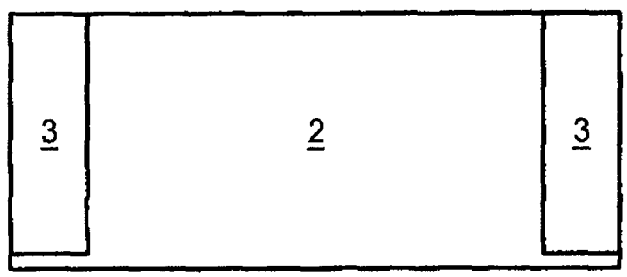
FIG. 1 is a somewhat simplified diagram illustrating a section of an integrated circuit according to one embodiment of the present disclosure.

FIG. 1 very schematically represents a section of an integrated circuit 1 comprising a substrate 2, made of, for example, silicon, and two insulation zones 3 of, for example, the shallow trench type (i.e., STI: Shallow Trench Isolation) according to one embodiment of the present disclosure.

Figure 2:
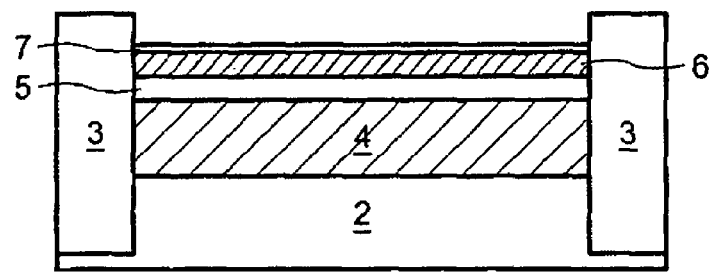
FIG. 2 is somewhat simplified diagram illustrating a section of the integrated circuit after the production of various layers according to one embodiment of the present disclosure.

FIG. 2 represents a section of the integrated circuit 1 after the production of various layers according to one embodiment of the present disclosure. In particular, after etching the substrate 2 between the zones 3, a first layer 4 comprising silicon-germanium is produced then a sacrificial layer 5 of silicon is produced.

In one embodiment, the layer 4 may be selected so as to have a relatively low proportion of germanium, for example between 20 and 40%. The thickness of the layer 4 may, for example, lie between 20 and 40 nm. The thickness of the layer 5 may be lie between 5 and 30 nm. The layer 5 determines the thickness of the tunnel and should be adapted so that the volume increase of the various layers during the oxidation does not prematurely fill the tunnel.

The layers 4 and 5 are produced for example by epitaxy, according to a facetless method (i.e., one which limits the appearance of facets at the side ends of the layers) according to one embodiment of the present disclosure. Conventional facetless methods such as those disclosed in the article "Investigation of Facet Formation In RTCVD Si/SiGe Selective Epitaxy" by Talbot, et al., (ECS Proceedings, Vol. 2004-07, p. 601) may be used to employ facetless epitaxy. In particular, reducing the temperature during the epitaxial growth of the various layers makes it possible to limit the growth rates of the crystallographic planes forming facets.

An intermediate layer 6 comprising a silicon-germanium alloy is then produced according to one embodiment of the present disclosure. The intermediate layer 6 has a high proportion of germanium, for example lying between 30 and 90% depending on the desired growth rate and the intended thickness. Specifically, the higher the proportion of germanium is in the layer 6, the smaller the thickness of the layer 6 is and the shorter the growth time is. The proportion of germanium, as well as the thickness, is therefore adapted to the deposition conditions and the germanium proportion subsequently desired in the channel of the transistor. Preferably, the layer 6 comprises a germanium proportion of more than 50% and a thickness of less than 10 nm. The layer 6 is also produced by epitaxy, according to a method which is conventional and known to the person skilled in the art. For example, the layer 6 may also be produced according to a facetless epitaxy method.

In one embodiment, the intermediate layer 6 is then covered with an upper layer 7 of silicon. The layer 7 may also be produced by epitaxy and has a thickness of less than 4 nm, preferably less than 2 nm. The layer 7 is not obligatory for production of the transistor, but it is preferable because it facilitates production of the gate insulator above the layer 6. In particular, depending on the material used for producing the gate insulator (which may for example comprise silicon oxide $SiO_2$ or a high dielectric constant ("high K") material, or a combination of the two), it is accordingly possible to select a different material for the layer or else not to deposit the layer 7. For instance, in the particular case in which the gate insulator is hafnium oxide $HfO_2$, it is possible either to deposit a layer 7 preferably comprising silicon-germanium oxide $SiGeO_x$ or not to deposit the layer 7.

Figure 3:
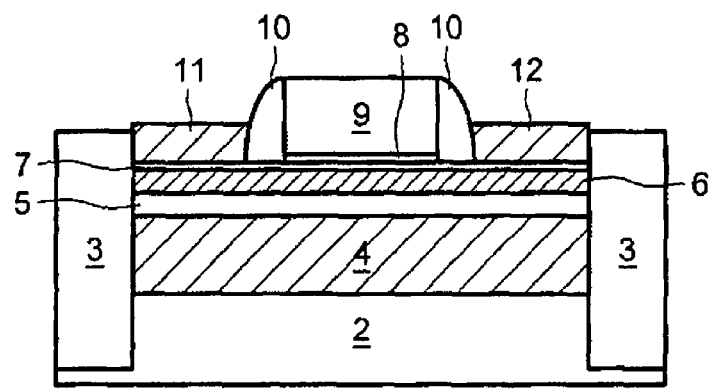
FIG. 3 is a somewhat simplified diagram illustrating the production of an insulated gate of the MOS transistor according to one embodiment of the present disclosure.

Generally, the production of the insulated gate of the MOS transistor is then carried out as generally shown in FIG. 3 according to one embodiment of the present disclosure. More precisely, this production involves first the formation of a gate oxide 8, in the present case silicon oxide, on the upper layer 7, then the formation of the gate 9. The latter is flanked by a first type of insulating regions or spacers 10, for example made of silicon nitride. Lastly, two silicon-germanium regions are produced by resuming epitaxy on the upper layer 7. This selective epitaxy is followed by conventional implantation so as to form the source and drain regions 11 and 12. The source and drain regions 11, 12 may, for example, comprise a germanium proportion of between 20 and 30% and advantageously have a thickness of about 30 nm. In particular, the size of the regions 11, 12 will be selected in order that they are not reduced too greatly during the oxidation step, so that it is still readily possible to produce the contacting on these two regions 11, 12.

Figure 4:
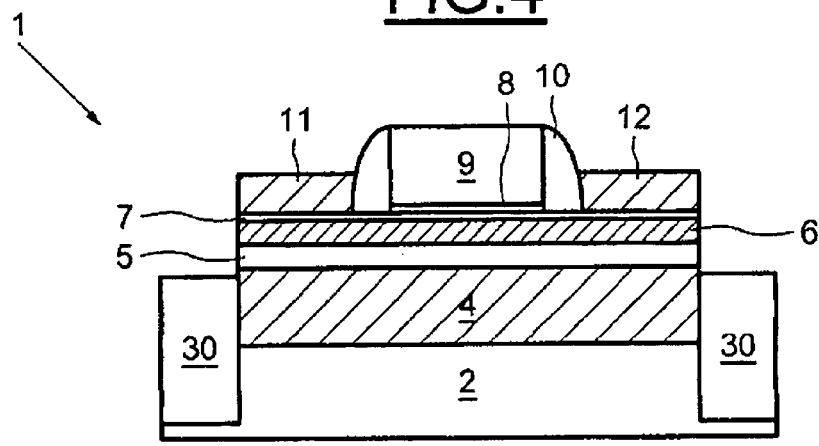
FIG. 4 is a somewhat simplified diagram illustrating the integrated circuit with etched insulating regions according to one embodiment of the present disclosure.

In one embodiment, the following steps consist in etching the insulating regions 3 in a way which is conventional for the person skilled in the art, so as to expose the side ends of the sacrificial layer 5. The side ends of the layer 5 may be accessible in particular by virtue of using the facetless epitaxy method. The integrated circuit 1 with the etched insulating regions 30 is therefore obtained as generally shown in FIG. 4.

Figure 5:
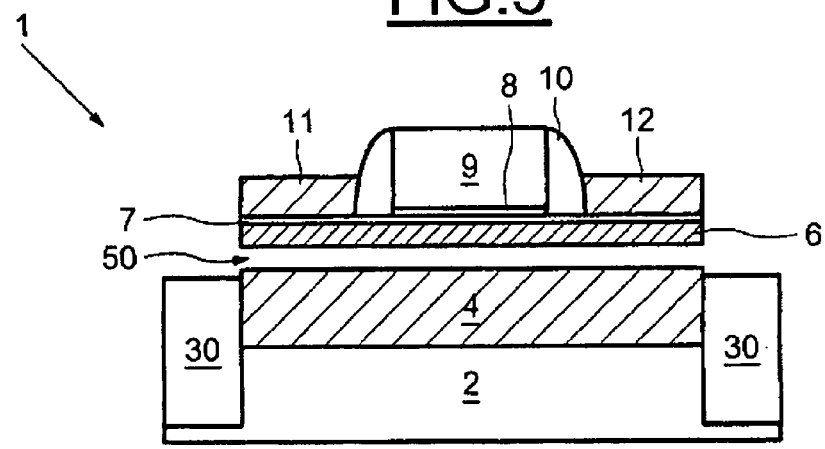
FIG. 5 is a somewhat simplified diagram illustrating a sacrificial layer etched selectively to form a tunnel exposing the lower surface of the intermediate layer according to one embodiment of the present disclosure.

In one embodiment, formation of the tunnel is then carried out by selective etching of the sacrificial layer 5 with respect to the layers 4 and 6. Selective etching of the layer 5 is known per se, and is carried out for example by etching with a plasma comprising tetrafluoromethane $CF_4$, oxygen $O_2$ and difluoromethane $CH_2F_2$. It makes it possible to remove the layer 5, which is the only silicon layer. In particular, the upper layer 7 is not etched because its thickness is too thin to permit effective and consistent removal. Furthermore, the upper layer 7 is not necessarily formed by facetless epitaxy, which makes it possible to cover the side ends of the layer 7 and therefore avoid etching it. The sacrificial layer 5 is therefore etched selectively so as to form a tunnel 50 exposing the lower surface of the intermediate layer 6 as generally shown in FIG. 5.

The following step consists in condensing the germanium into the channel region. Oxidation of the intermediate layer 6 is therefore carried out starting from its lower surface. The oxidation is carried out in an oxidizing atmosphere, preferably at a temperature of between 900° C. and 1200° C. In particular, reference may be made to the article by Tezuka, et al. for further details concerning such an oxidation method. In one embodiment, oxidation of the lower surface of the layer 6 is possible by virtue of the tunnel 50. A silicon oxide layer 13 is thus formed starting from the lower surface of the intermediate layer 6, but also on all the exposed surfaces which contain silicon. A silicon oxide layer 14 is therefore obtained on the side surfaces of the intermediate layer 6 and of the source and drain regions 11 and 12.

Figure 6:
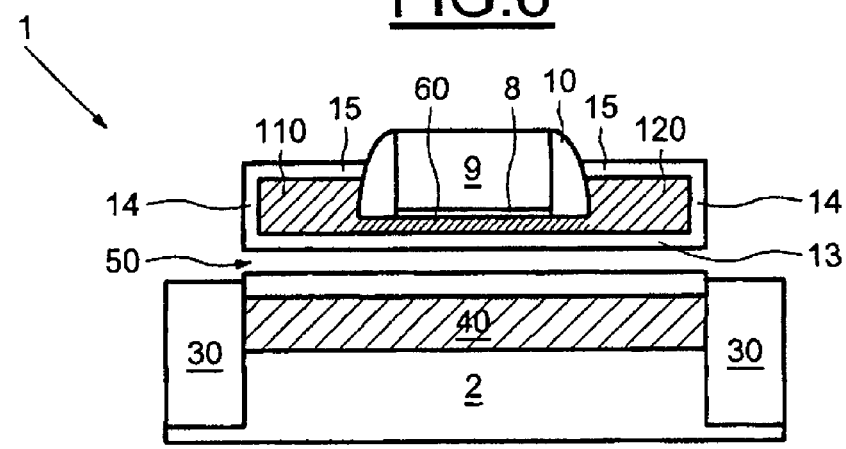
FIG. 6 is a somewhat simplified diagram illustrating layers of silicon oxide formed so that other layers and regions decrease in size and become enriched with a germanium to form still other layers and regions according to one embodiment of the present disclosure.

According to one embodiment of the present disclosure, a silicon oxide layer 15 is also obtained on the upper surface of the source and drain regions 11 and 12, and a silicon oxide layer 16 is obtained on the upper surface of the first layer 4. As the layers 13, 14, 15, 16 of silicon oxide are being formed, the layers 4, 6 and the regions 11, 12 decrease in size and become enriched with a germanium, in order to give layers 40, 60 and regions 110, 120 (see FIG. 6). In one embodiment, the upper layer 7 has disappeared during the oxidation step, because the germanium atoms of the intermediate layer 6 are concentrated into the region lying under the channel (i.e., into the region where there is a part of the upper layer 7). The layer 7, therefore, comprises silicon-germanium, like the non-oxidized part of the layer 6, and the two layers then form the channel region 60.

In one embodiment, the region 60 comprises the germanium atoms initially present in the intermediate layer 6, whereas the silicon atoms of the layers 6 and 7 have at least in part been oxidized during the oxidation step. If it is desired to produce a transistor with a channel 60 comprising essentially germanium, it is sufficient to oxidize the layers 6 and 7 for a sufficient time in order to convert almost all the silicon atoms into silicon oxide. The germanium atoms remaining will then formed the channel of the transistor 60.

Figure 7:
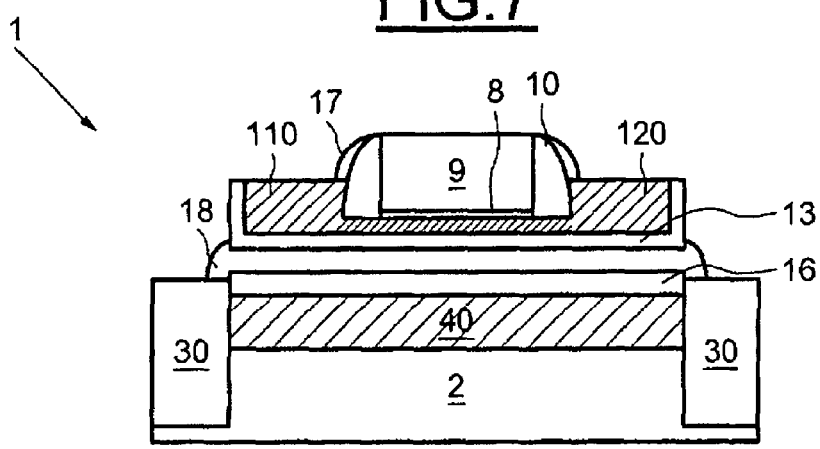
FIG. 7 is a somewhat simplified diagram illustrating a tunnel filled with dielectric material in order to form a complete region of dielectric according to one embodiment of the present disclosure.

Once the oxidation step has been completed, the oxide layer 15 is etched conventionally so as to access the source and drain regions 110 and 120 according to one embodiment of the present disclosure. Insulating regions or spacers 17 of a second type are then produced, for example from silicon nitride. The tunnel 50 may also be filled with a dielectric material 18, for example silicon nitride, in order to form a complete region 16, 18, 13 of dielectric and the channel, and drain and source regions 60, 110, 120 as generally shown in FIG. 7. In one embodiment, the rest of the method for producing the transistor is somewhat conventional, and involves in particular the contacting on the source, drain and gate regions 110, 120, 9.

As illustrated in FIG. 7, a transistor with a silicon-germanium or fully depleted germanium channel is then obtained according to one embodiment of the present disclosure. This transistor lies on a stack of layers 16, 18, 13 resting on a substrate 2, this stack of layers being dielectric. Moreover, the gate insulating layer 8 lies above the silicon-germanium channel 60 and has not been modified since its deposition on the upper layer 7 of silicon. The interface between the layer 8 and the channel 60 has therefore retained a surface quality similar to that between the layer 8 and the layer 7.

In one embodiment, the fineness of the channel layer 60 is determined in particular by the quantity of germanium present in the initial intermediate layer 6 and by the oxidation time. This fineness is selected so that good control of the short channel effects is geometrically permitted. Moreover, using germanium in the channel 60 will make it possible to improve the mobility of the charge carriers moving in the channel 60.

Furthermore, the possibility of producing the layers 4, 5 and 6 locally by epitaxy makes it possible to integrate the transistors obtained according to one embodiment of the present disclosure into silicon or silicon-on-insulator wafers. It is then relatively easy to juxtapose different transistors corresponding to various technologies, according to requirements.

Lastly, one embodiment of the present disclosure make it possible to produce the gate oxide 8 on the upper layer 7 of silicon before the oxidation step. The Si-O bonds which appear at the interface between the upper layer 7 and the gate oxide 8 are thus stable, and are not liable to be disrupted during concentration of the germanium in proximity to this surface. This avoids possible defects, such as electrical defects, at the interface between the semiconductor and the gate oxide.

Figure 8:
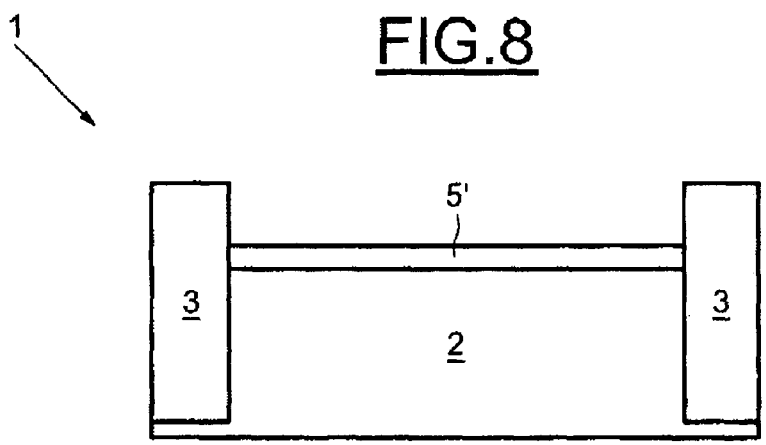
FIG. 8 is a somewhat simplified diagram illustrating a sacrificial layer made of dielectric material according to one embodiment of the present disclosure.
Figure 9:
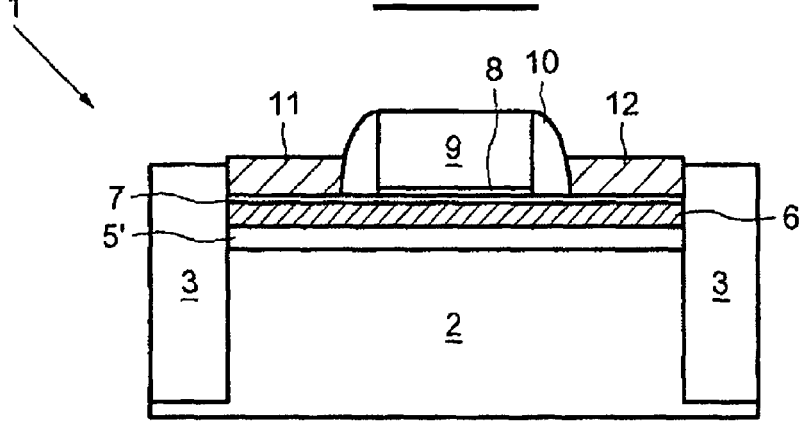
FIG. 9 is another somewhat simplified diagram is a somewhat simplified diagram illustrating a sacrificial layer made of dielectric material according to one embodiment of the present disclosure.

It should be understood that the present disclosure is not limited to the embodiments which have just been described; rather it encompasses all variants thereof. For instance, as illustrated in FIGS. 8 and 9, it is possible to produce a sacrificial layer 5' made of dielectric material, for example silicon oxide according to one embodiment of the present disclosure. It is then no longer necessary to use a facetless epitaxy method (since the dielectric layer is not deposited by epitaxy). It is subsequently sufficient to carry out the steps of forming the layers 6, 7, 8 and the regions 9, 10, 11, 12 in order to obtain a transistor similar to the one represented in FIG. 3. The tunnel will then be produced by selective etching of the dielectric material 5'. This selective etching is known per se and may, for example, be carried out by chemical etching with a solution of hydrofluoric acid HF. The rest of the method may take place similarly as in the first embodiment described.

In one embodiment, it is also possible to produce the transistor without producing the layers 4, 5 (and optionally 6, 7) by facetless epitaxy. In particular, it is possible to produce the said layers by conventional epitaxy before producing the insulation zones 3 (STI), then to etch the facetted ends of the stack (in a way which is known to the person skilled in the art), and finally to produce the insulation regions 3 at the etched zones. An integrated circuit similar to the one represented in FIG. 2 is then obtained, on the basis of which the same steps of the method may be reproduced as in the first embodiment described. When producing the insulating regions 3, however, care will be taken to use a dielectric material which does not require a significant heat budget during its production, so as not to damage the layers 4, 5 (and optionally 6, 7) which are produced by epitaxy and in which there may be stresses.

Accordingly, a transistor fabricated in accordance with one embodiment of the present disclosure includes a germanium-rich channel. The germanium-rich channel is produced by oxidation of the silicon contained in the silicon-germanium intermediate layer starting from the lower surface of the said intermediate layer. The germanium atoms are therefore caused to migrate towards the upper surface of the silicon-germanium intermediate layer, and are stopped by the gate insulating layer. The migration of the atoms during the oxidation step is thus less prejudicial to the performance of the transistor, since the gate insulator of the transistor has already been produced and is not modified during this step. The migration of the germanium atoms towards the gate insulator, which is immobile, leads to a limitation of the surface defects between the channel and the insulator.

Furthermore, the transistor can be produced on any type of substrate according to one embodiment of the present disclosure. This is because during the oxidation phase, the germanium atoms move away from the substrate and are stopped by a layer produced above the silicon-germanium intermediate layer. It is therefore easy to select the material of the stop layer (which will constitute the gate insulator) and there is no longer any particular constraint on the type of substrate to be used.

In one embodiment, the present disclosure makes it possible to produce either transistors with a silicon-germanium on insulator channel, or transistors with a germanium-on-insulator channel. This is because by oxidizing the silicon-germanium intermediate layer for a sufficient time, on the one hand the germanium is condensed (i.e., the germanium concentration is increased in proximity to the gate insulator, and on the other hand the remaining silicon is oxidized). It is thus possible to obtain a channel then containing only germanium. In one embodiment, the method then makes it possible to obtain a germanium-channel transistor without the need to deposit a pure germanium layer. The germanium channel is formed by condensing the germanium atoms, initially present in the intermediate layer, into the regions situated under the gate insulator. The germanium is therefore concentrated into a smaller space, in particular by making the other atoms of the intermediate layer react. In one embodiment, this method makes it possible to replace the deposition of pure germanium by the deposition of silicon-germanium, which is easier, more rapid and of better quality.

In one embodiment, the upper layer is not indispensable for production of the layer. For example, the gate oxide or dielectric may be formed directly on the intermediate layer. This upper layer nevertheless has the advantage of permitting a better interface with the gate insulator. When the gate oxide is silicon oxide and the upper layer is a silicon layer, for example, depositing a silicon oxide layer on a silicon layer makes it possible to limit the surface defects and to obtain a better interface between the two layers. Furthermore, since the migration of the germanium atoms during the oxidation phase takes place starting from the opposite surface of the silicon-germanium intermediate layer, the method makes it possible to preserve this high-quality interface between the channel and the silicon oxide layer. The main purpose of the silicon layer is to allow better-quality deposition of the gate insulator. According to one embodiment, it is therefore not necessary to produce the upper layer with a large thickness. Furthermore, this layer is intended to be enriched with germanium during the oxidation phase. It is therefore preferable to limit the size of the upper layer in order to limit the quantity of silicon remaining in the channel of the transistor. Lastly, too large a thickness of the upper layer could permit localized oxidation of it, which would lead to a larger thickness of the gate insulator which comprises silicon oxide. Thus, the upper layer is preferably a silicon layer formed by epitaxy and having a thickness of less than 4 nm, for example 1 nm.

In addition, one embodiment of the present disclosure makes it possible to carry out the oxidation by contact of the layer to be oxidized with an oxidizing atmosphere. In order to gain access to the lower surface of the intermediate layer to be oxidized, a sacrificial layer is produced under the intermediate layer then is etched selectively in order to create a tunnel exposing the lower surface of the intermediate layer. It is then sufficient to place the integrated circuit in an oxidizing atmosphere in order to carry out the oxidation.

In one embodiment, the tunnel is preferably filled with a dielectric material after oxidation of the lower surface of the intermediate layer. This is because during oxidation of the intermediate layer, although an increase in the thickness of the layer occurs owing to oxidation of the silicon to silicon oxide, this increase nevertheless may not necessarily make it possible to fill the tunnel completely. A dielectric material may then be deposited in order to create an entirely dielectric zone under the channel.

According to one embodiment, the sacrificial layer comprises silicon and is formed on a first layer containing an alloy of silicon and germanium. This embodiment thus proposes producing the sacrificial layer from silicon between two silicon-germanium layers, in order to permit selective etching of the sacrificial layer. The sacrificial layer thus makes it possible to define the size and the position of the tunnel which will be formed, in order to subsequently carry out the oxidation step.

It should be understood that the term facetless epitaxy is intended to mean an epitaxy method making it possible to avoid covering one layer with another at the side ends. In particular, when a layer is being grown by epitaxy, certain crystallographic planes which are not parallel to the surface of the substrate may grow and create a layer with oblique ends. These oblique ends, which are referred to as facets, are to be avoided because they may be completely covered by the following layers and thus prevent gaining access laterally to the layer. It is then no longer possible to etch the layer via its ends.

According to one embodiment, the sacrificial layer is a dielectric layer formed above the substrate. This embodiment makes it possible to use the selective etching of dielectric materials with respect to semiconductor materials. In particular, it is possible to produce the sacrificial layer on a semiconductor substrate which will not be etched by the selective etching. The dielectric layer then defines the size and the position of the tunnel which makes it possible to expose the lower surface of the intermediate layer. Preferably, the intermediate layer has a thickness of between 5 nm and 15 nm, preferably less than 10 nm, and a germanium proportion of between 30% and 90%, preferably more than 50%.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method for fabricating a metal-oxide semiconductor (MOS) transistor, the method comprising:
   forming a sacrificial layer on a substrate between two insulation regions, wherein the sacrificial layer is formed by facetless epitaxy;
   disposing an intermediate layer on the sacrificial layer between the two insulation regions, wherein the intermediate layer comprises an alloy of silicon and germanium and is formed by facetless epitaxy;
   disposing a source, a drain and an insulated gate region above the intermediate layer; and
   thereafter etching the two insulation regions to expose side ends of the sacrificial layer, etching the sacrificial layer to expose a lower surface of the intermediate layer, and oxidizing the intermediate layer from the lower surface of the intermediate layer, wherein the oxidizing increases a concentration of the germanium in proximity to the insulated gate region, thereby forming a germanium-rich channel.

2. The method according to claim 1, wherein the step of disposing the source further comprises:
   disposing an upper layer on the intermediate layer; and
   producing the source, the drain and the insulated gate regions on the upper layer.

3. The method according to claim 2, wherein the upper layer is a silicon layer formed by epitaxy.

4. The method according to claim 3, wherein the upper layer has a thickness of less than 4 nm.

5. The method according to claim 1, wherein the step of etching the sacrificial layer further comprises:
   etching the sacrificial layer to obtain a tunnel exposing the lower surface of the intermediate layer; and
   oxidizing the lower surface of the intermediate layer in the tunnel.

6. The method according to claim 5, wherein the step of oxidizing the lower surface of the intermediate layer further comprises filling the tunnel with a dielectric material.

7. The method according to claim 5, wherein the sacrificial layer comprises silicon and is formed on a first layer containing an alloy of silicon and germanium.

8. The method according to claim 7, wherein:
   the step of forming a sacrificial layer on a substrate further comprises forming the first layer by facetless epitaxy; and
   the step of etching the sacrificial layer further comprises selectively etching the sacrificial layer with respect to the first layer and the intermediate layer.

9. The method according to claim 5, wherein the sacrificial layer is a dielectric layer formed above the substrate.

10. The method according to claim 1, wherein the intermediate layer has a thickness of at least of between 5 nm and 15 nm.

11. The method according to claim 1, wherein the intermediate layer has a thickness of less than 10 nm.

12. The method according to claim 1, wherein the intermediate layer comprises between 30% and 90% germanium.

13. The method according to claim 1, wherein the intermediate layer comprises about 50% germanium.

14. A method for fabricating a metal-oxide semiconductor (MOS) transistor, the method comprising:
   forming a sacrificial layer on a substrate by facetless epitaxy;
   disposing an intermediate layer on the substrate by facetless epitaxy, at least a portion of a lower surface of the intermediate layer disposed on the sacrificial layer, wherein the intermediate layer comprises an alloy of silicon and germanium;
   disposing a source, a drain and an insulated gate region above the intermediate layer;
   etching insulation regions to expose side ends of the sacrificial layer;
   etching the sacrificial layer to obtain a tunnel exposing the lower surface of the intermediate layer; and
   thereafter oxidizing the lower surface of the intermediate layer in the tunnel, wherein the oxidizing increases a concentration of the germanium in proximity to the insulated gate, thereby forming a germanium-rich channel.

15. The method according to claim 14, wherein the step of disposing the source further comprises:
   disposing an upper layer on the intermediate layer; and
   producing the source, the drain and the insulated gate regions on the upper layer.

16. The method according to claim 14, further comprising filling the tunnel with a dielectric material.

17. The method according to claim 14, wherein the sacrificial layer comprises silicon and is formed on a first layer containing an alloy of silicon and germanium.

18. The method according to claim 17, wherein:
   the step of forming a sacrificial layer on a substrate further comprises forming the first layer by facetless epitaxy; and
   the step of etching the sacrificial layer further comprises selectively etching the sacrificial layer with respect to the first layer and the intermediate layer.

19. The method according to claim 14, wherein the sacrificial layer is a dielectric layer formed above the substrate.

20. The method according to claim 15, wherein the upper layer is a silicon layer formed by epitaxy.

* * * * *